(12) United States Patent
Tsuda et al.

(10) Patent No.: US 12,716,948 B2
(45) Date of Patent: Aug. 25, 2026

(54) BATTERY SIMULATOR

(71) Applicant: RENESAS ELECTRONICS CORPORATION, Tokyo (JP)

(72) Inventors: Tetsuji Tsuda, Tokyo (JP); Saika Arai, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 1009 days.

(21) Appl. No.: 17/934,048

(22) Filed: Sep. 21, 2022

(65) Prior Publication Data

US 2024/0094299 A1 Mar. 21, 2024

(51) Int. Cl.

| | |
|---|---|
| ***G01R 31/374*** | (2019.01) |
| ***G01R 31/28*** | (2006.01) |
| ***G01R 31/3835*** | (2019.01) |
| ***H01M 10/42*** | (2006.01) |

(52) U.S. Cl.

CPC ....... *G01R 31/374* (2019.01); *G01R 31/2848* (2013.01); *G01R 31/3835* (2019.01); *H01M 10/425* (2013.01); *H01M 2220/20* (2013.01)

(58) Field of Classification Search

CPC .............. G01R 31/374; G01R 31/2848; G01R 31/3835; G01R 31/367; H01M 10/425; H01M 2220/20

See application file for complete search history.

(56) References Cited

U.S. PATENT DOCUMENTS

| | | | | |
|---|---|---|---|---|
| 9,263,777 | B2 | 2/2016 | Kawahara et al. | |
| 2003/0236656 | A1* | 12/2003 | Dougherty ............ | G06F 30/367 703/14 |
| 2014/0244225 | A1* | 8/2014 | Balasingam ....... | G01R 31/3835 703/2 |
| 2016/0012168 | A1* | 1/2016 | Chen ..................... | G06F 30/398 716/107 |

(Continued)

FOREIGN PATENT DOCUMENTS

| | | |
|---|---|---|
| JP | 2010267570 A | * 11/2010 |
| JP | 2014-119265 A | 6/2014 |

(Continued)

OTHER PUBLICATIONS

Yuejiu Zheng, Zhihe Shi, Dongxu Guo, Haifeng Dai, Xuebing Han, A simplification of the time-domain equivalent circuit model for lithium-ion batteries based on low-frequency electrochemical impedance spectra, Journal of Power Sources. https://doi.org/10.1016/j.jpowsour.2021.229505. (Year: 2021).*

(Continued)

*Primary Examiner* — Rehana Perveen
*Assistant Examiner* — Narciso Eduardo Montes
(74) *Attorney, Agent, or Firm* — RIMON P.C.

(57) ABSTRACT

A battery simulator includes a circuit simulator that simulates an operation of an RC parallel circuit which is an equivalent circuit of a battery to be monitored and an RC parallel circuit optimization device that optimizes the RC parallel circuit based on a monitoring frequency of the (Continued)

battery, wherein the RC parallel circuit optimization device is configured to: delete a capacitance value of the RC parallel circuit when the monitoring frequency is determined to be a low frequency, and delete resistance and capacitance values of the RC parallel circuit when the monitoring frequency is determined to be a high frequency.

5 Claims, 11 Drawing Sheets

(56) References Cited

U.S. PATENT DOCUMENTS

| | | | | |
|---|---|---|---|---|
| 2016/0223618 | A1 | 8/2016 | Yokota | |
| 2016/0252585 | A1* | 9/2016 | Baba | G01R 31/389<br>702/63 |

FOREIGN PATENT DOCUMENTS

| | | | | |
|---|---|---|---|---|
| JP | 2016-138868 A | | 8/2016 | |
| KR | 102171199 B1 | * | 10/2020 | G01R 31/389 |
| WO | WO-0115023 A1 | * | 3/2001 | G06F 30/367 |

OTHER PUBLICATIONS

Horowitz M, Plummer J, Howe R. E40M RC Circuits and Impedance. https://web.stanford.edu/class/archive/engr/engr40m.1178/ slides_sp17/lecture13.pdf (Year: 2017).*

Cleaver T. ECE252 Lesson 15. engineering.louisville.edu. Published Oct. 25, 2021. https://engineering.louisville.edu/raise/ECE252/L15.htm (Year: 2021).*

* cited by examiner

Figure 1:
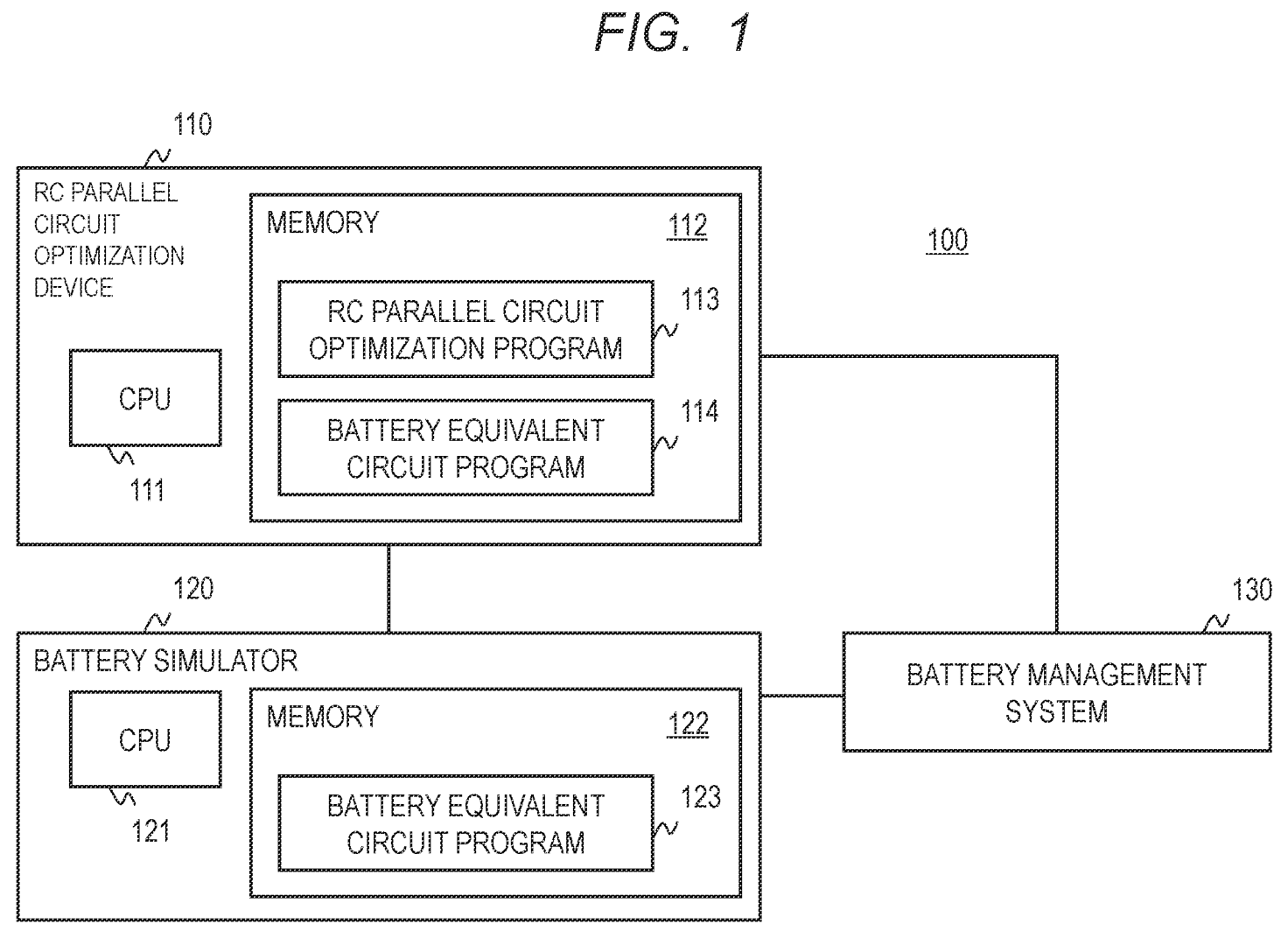

110 RC PARALLEL CIRCUIT OPTIMIZATION DEVICE

111 CPU

112 MEMORY

113 RC PARALLEL CIRCUIT OPTIMIZATION PROGRAM

114 BATTERY EQUIVALENT CIRCUIT PROGRAM

120 BATTERY SIMULATOR

121 CPU

122 MEMORY

123 BATTERY EQUIVALENT CIRCUIT PROGRAM

130 BATTERY MANAGEMENT SYSTEM

FIG. 2

RC parallel circuit

Imaginary part *(-1)

$\omega = 1/RC$

High frequency

Low frequency

Real part

2 RC parallel circuits

Imaginary part *(-1)

Real part

0 e f d k RC parallel circuits (n<k)

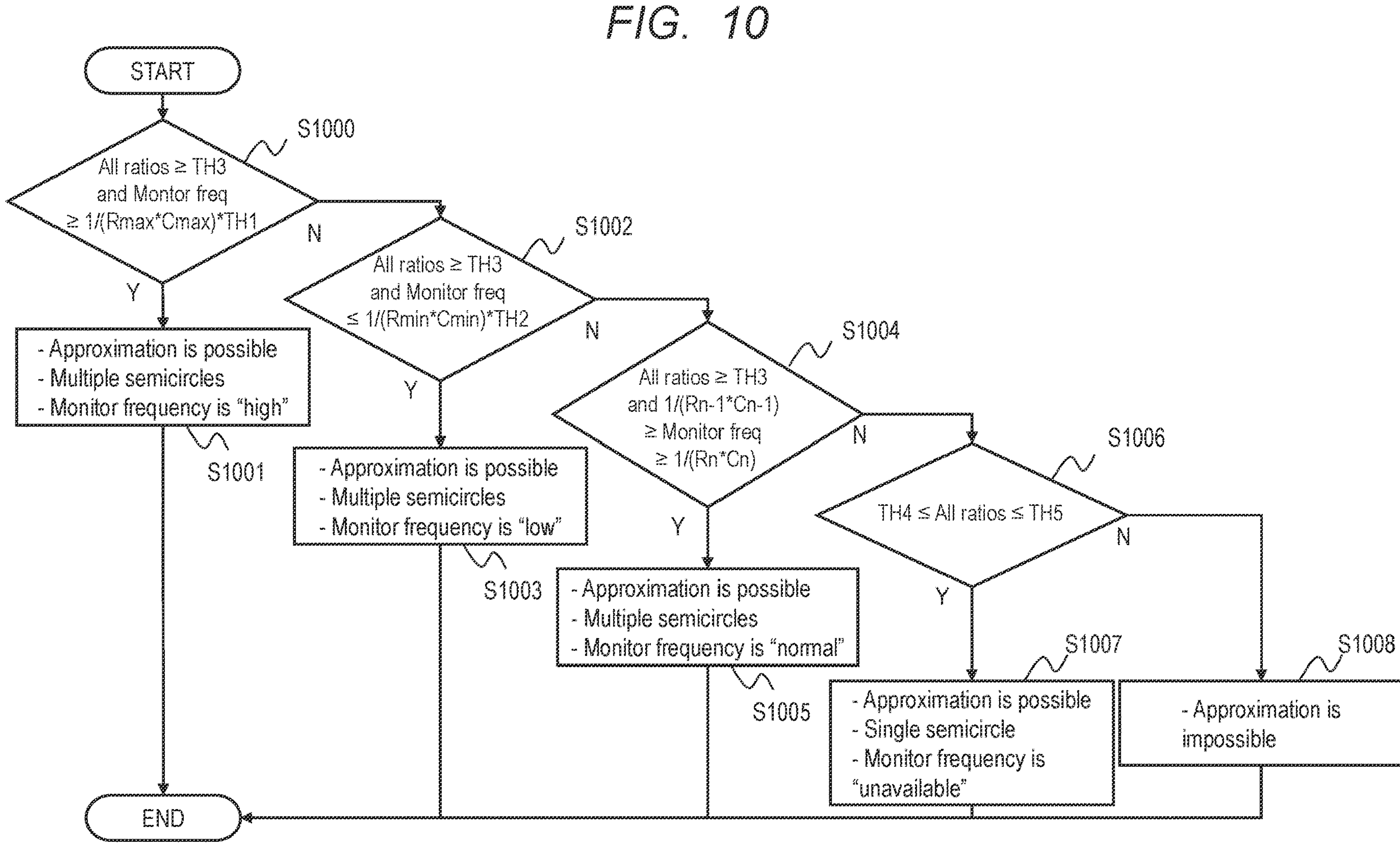
FIG. 10
START
S1000
All ratios ≥ TH3 and Montor freq ≥ 1/(Rmax*Cmax)*TH1
Y
N
S1001
- Approximation is possible
- Multiple semicircles
- Monitor frequency is "high"
S1002
All ratios ≥ TH3 and Monitor freq ≤ 1/(Rmin*Cmin)*TH2
Y
N
S1003
- Approximation is possible
- Multiple semicircles
- Monitor frequency is "low"
S1004
All ratios ≥ TH3 and 1/(Rn-1*Cn-1) ≥ Monitor freq ≥ 1/(Rn*Cn)
Y
N
S1005
- Approximation is possible
- Multiple semicircles
- Monitor frequency is "normal"
S1006
TH4 ≤ All ratios ≤ TH5
Y
N
S1007
- Approximation is possible
- Single semicircle
- Monitor frequency is "unavailable"
S1008
- Approximation is impossible
END

FIG. 11

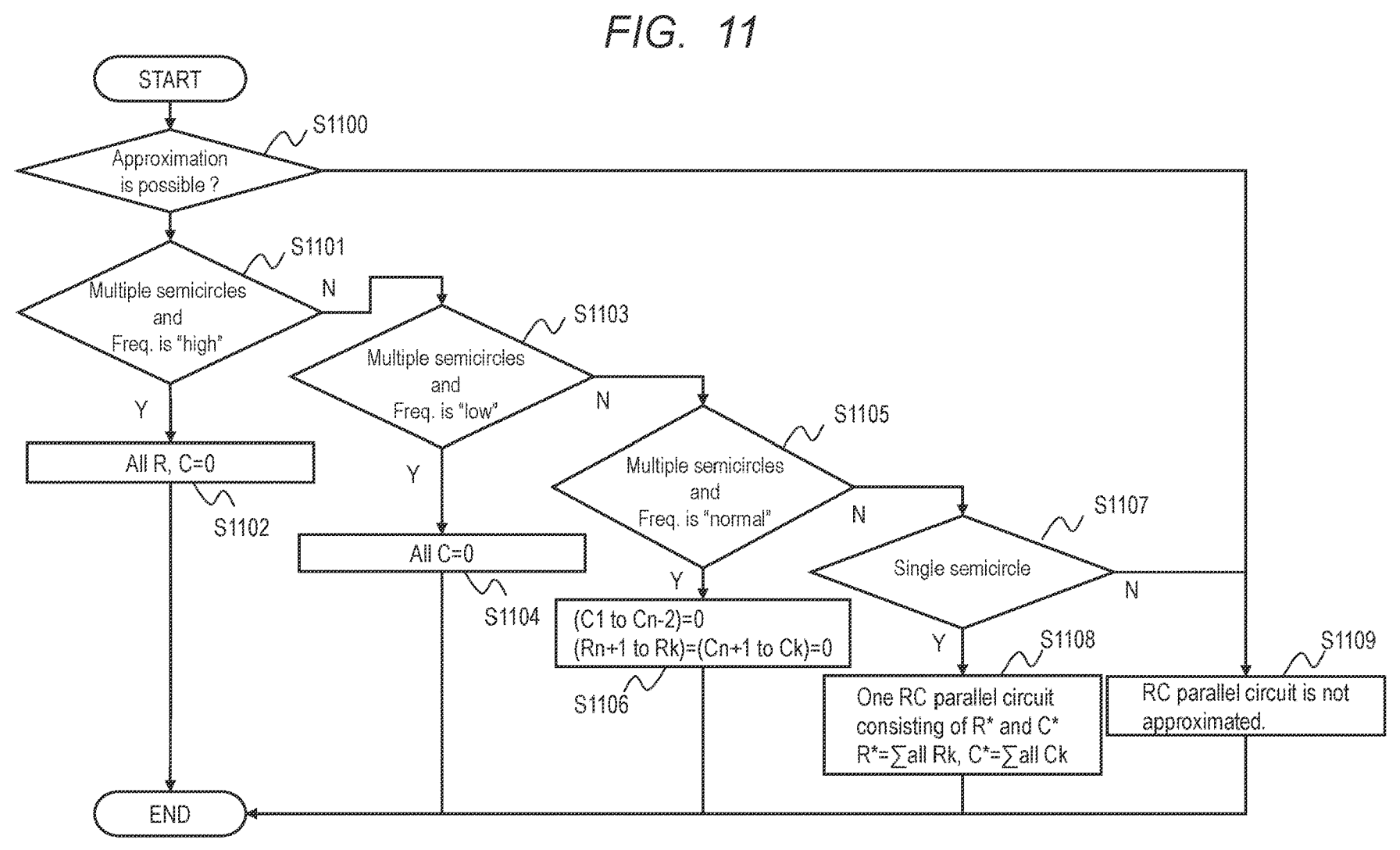

START

S1100 Approximation is possible ?

S1101 Multiple semicircles and Freq. is "high"

S1102 All R, C=0

S1103 Multiple semicircles and Freq. is "low"

S1104 All C=0

S1105 Multiple semicircles and Freq. is "normal"

S1106 (C1 to Cn-2)=0
(Rn+1 to Rk)=(Cn+1 to Ck)=0

S1107 Single semicircle

S1108 One RC parallel circuit consisting of R* and C*
R*=∑all Rk, C*=∑all Ck

S1109 RC parallel circuit is not approximated.

Y N

END

BATTERY SIMULATOR

BACKGROUND

The present invention relates to a battery simulator used in the development of a battery management system.

THE BACKGROUND OF THE INVENTION

In recent years, lithium-ion batteries have been used as batteries for electric vehicles (EVs) and hybrid electric vehicles (HEVs). In a system in which a lithium-ion battery is mounted, a battery management system for managing a voltage, a current, and a temperature of the lithium-ion battery is also generally mounted.

When the battery management system is developed, it is verified whether the battery management system operates normally. Although the battery management system may be verified using a verification system with an actual battery, this verification method is dangerous, particularly in the early stages of development. T his is because the actual battery has high voltage, large current, high temperature, and large weight. Therefore, in the verification at the time of development of the battery management system, a battery simulator simulating the operation of the actual battery is used.

Patent Documents 1 and 2 describe a technique related to a battery monitoring system.

PRIOR-ART DOCUMENT

Patent Document

[Patent Document 1] Japanese Unexamined Publication Laid-Open No. 2016-138868

[Patent Document 2] Japanese Unexamined Publication Laid-Open No. 2014-119265

SUMMARY

The battery simulator simulates the operation of an actual battery. For example, the operation can be simulated by expressing the battery in an equivalent circuit and causing the equivalent circuit to operate on the circuit simulator. As an example of the equivalent circuit of a battery, the equivalent circuit of a battery (unit cell) is described in FIG. 3 of Patent Document 2. Specifically, the equivalent circuit includes a voltage source (OCV), a resistor (R), and an RC parallel circuit (rp, Cp).

The battery simulator can be configured by connecting a plurality of the equivalent circuits in accordance with a configuration (number of unit cells) of a battery actually used. However, as the number of equivalent circuits increases, the operation of the battery simulator becomes slower. For example, when the battery simulator is configured with a CPU, a memory, and an operation program, the CPU load and the amount of used memory increase, and the operation becomes slow. Since the battery simulator requires the same operating speed (response) as the actual battery, improvement measures are required. It is also possible to improve the processing performance of the CPU and the capacity of the memory, but the cost is increased. Another improvement technique is needed.

Other objects and novel features will become apparent from the description of the specification and drawings.

A battery simulator according to an embodiment includes a circuit simulator that simulates an operation of an RC parallel circuit which is an equivalent circuit of a battery to be monitored and an RC parallel circuit optimization device that optimizes the RC parallel circuit based on a monitoring frequency of the battery, wherein the RC parallel circuit optimization device is configured to: delete a capacitance value of the RC parallel circuit when the monitoring frequency is determined to be a low frequency, and delete resistance and capacitance values of the RC parallel circuit when the monitoring frequency is determined to be a high frequency.

According to the present invention, it is possible to reduce the CPU load and the amount of used memory of the battery simulator.

BRIEF DESCRIPTION OF THE DRAWINGS

FIG. 1 is a block diagram of a verification environment of a battery management system according to an embodiment.

FIG. 2 is a diagram for explaining the combined impedance of an RC parallel circuit.

FIG. 3 is a diagram for explaining the combined impedance of the RC parallel circuit.

FIG. 10 is a flowchart for explaining the operation of the embodiment.

FIG. 11 is a flowchart for explaining the operation of the embodiment.

DETAILED DESCRIPTION

Figure 4:
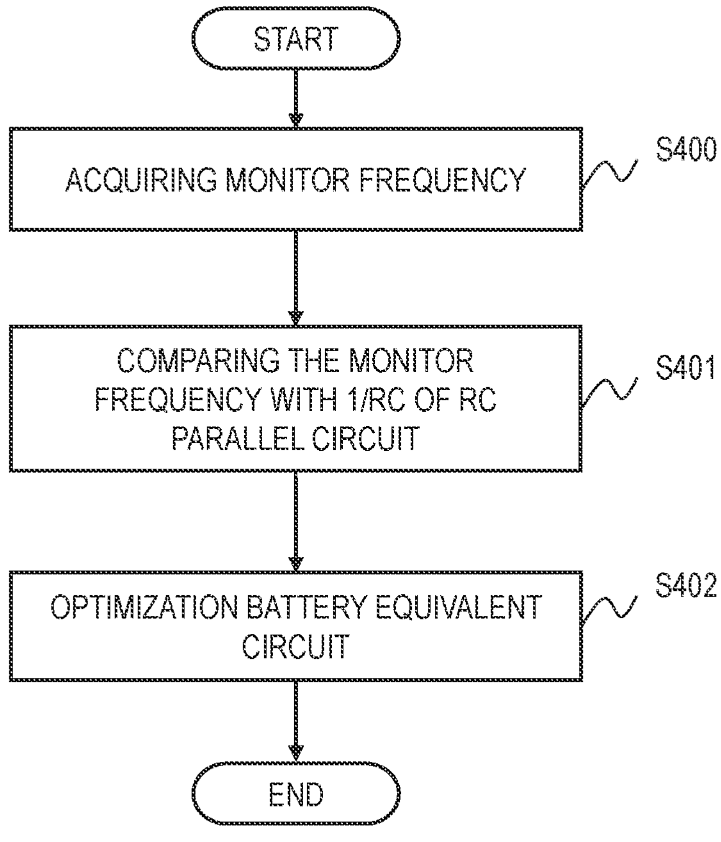
FIG. 4 is a flowchart for explaining the operation of the embodiment.

Hereinafter, a battery simulator according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

Embodiment

FIG. 1 is a block diagram of a verification environment 100 of a battery management system using a battery simulator according to an embodiment. As illustrated in FIG. 1, the verification environment 100 includes an RC parallel circuit optimization device 110, a battery simulator 120, and a battery management system 130.

The verification environment 100 verifies the operation of the battery management system 130. As described above, the battery management system 130 is connected to the battery to manage the voltage, current, and temperature of the battery. The battery management system 130 includes various ICs, microcontrollers, and the like.

The battery management system 130 monitors the battery at various cycles (referred to as monitoring cycles or monitoring frequencies). For example, in order to detect an anomaly of a battery, it is necessary to monitor the battery at a high monitoring frequency. On the other hand, in order to estimate the charge rate and the degradation rate of the battery (both obtained from the voltage, current, and temperature of the battery), the monitoring frequency is sufficient even at a lower level.

The RC parallel circuit optimization device 110 is connected to the battery simulator 120 and the battery management system 130, and controls the battery simulator 120 and the battery management system 130. The RC parallel circuit optimization device 110 is a personal computer or a workstation, and includes a CPU 111 and memory 112. The memory 112 stores an RC parallel circuit optimization program 113 and a battery equalization circuit program 114. The RC parallel circuit optimization program 113 is executed by CPU 111 to optimize the battery equalization circuit program 114. Specifically, the configuration of the RC parallel circuit for simulating the operation of the battery is changed in accordance with the above-described monitoring frequency. In the present embodiment, the RC parallel circuit optimization program 113 is characterized. Details will be described later.

Note that the RC parallel circuit optimization device 110 may also be referred to as a battery simulator together with the battery simulator 120.

The battery simulator 120 includes a CPU 121 and memory 122. The memory 122 stores a battery equalization circuit program 123. The battery equalization circuit program 123 is downloaded from the RC parallel circuit optimization device 110 and is the same as the battery equalization circuit program 114. When CPU 121 executes the program 123 of the battery equalization circuit, the battery simulator 120 performs an operation simulating a circuit simulator of the battery equivalent circuit, that is, an actual battery. The execution result of the battery equalization circuit program 123 (the voltage, current, and temperature of the RC equivalent circuit) is transmitted to the battery management system 130 as the operation result of the actual battery.

Next, the RC parallel circuit optimization program 113, which is a feature of the first embodiment, will be described in detail.

First, the characteristics of the RC parallel circuit will be described with reference to FIG. 2. The combined impedance Z of the RC parallel circuit is expressed by the following equation.

$$\frac{1}{Z} = \frac{1}{R} + j\omega C$$

$$Z = \frac{R}{1+\omega^2C^2R^2} - j\frac{\omega CR^2}{1+\omega^2C^2R^2}$$

The combined impedance Z is a complex number having a real part (first term) and an imaginary part (second term). FIG. 2 is a Cole-Cole plot illustrating the combined impedance Z when the horizontal axis is a real number, the vertical axis is an imaginary number, and the angular frequency ω (ω=2πf when the frequency is f) is changed. As shown in FIG. 2, the combined impedance Z is a semicircle having a diameter corresponding to the resistance value R.

The combined impedance Z can be classified according to frequency as follows. a. At low frequencies, the combined impedance Z can be approximated to the resistance value R. That is, the capacitance value C can be omitted. b. At high frequencies, the combined impedance Z can be approximated to a resistance 0. That is, the resistance value R and the capacitance value C can be omit ted. c. When the frequency is between case a and case b, the resistance value R and the capacitance value C cannot be omitted. He re, the high frequency or the low frequency may be determined based on 1/RC. This is because the frequency of the apex of the semicircle is determined by 1/RC. For example, when the frequency is 1/10 or less of 1/RC, the frequency may be a low frequency, and when the frequency is 10 times or more of 1/RC, the frequency may be a high frequency.

Figure 2:
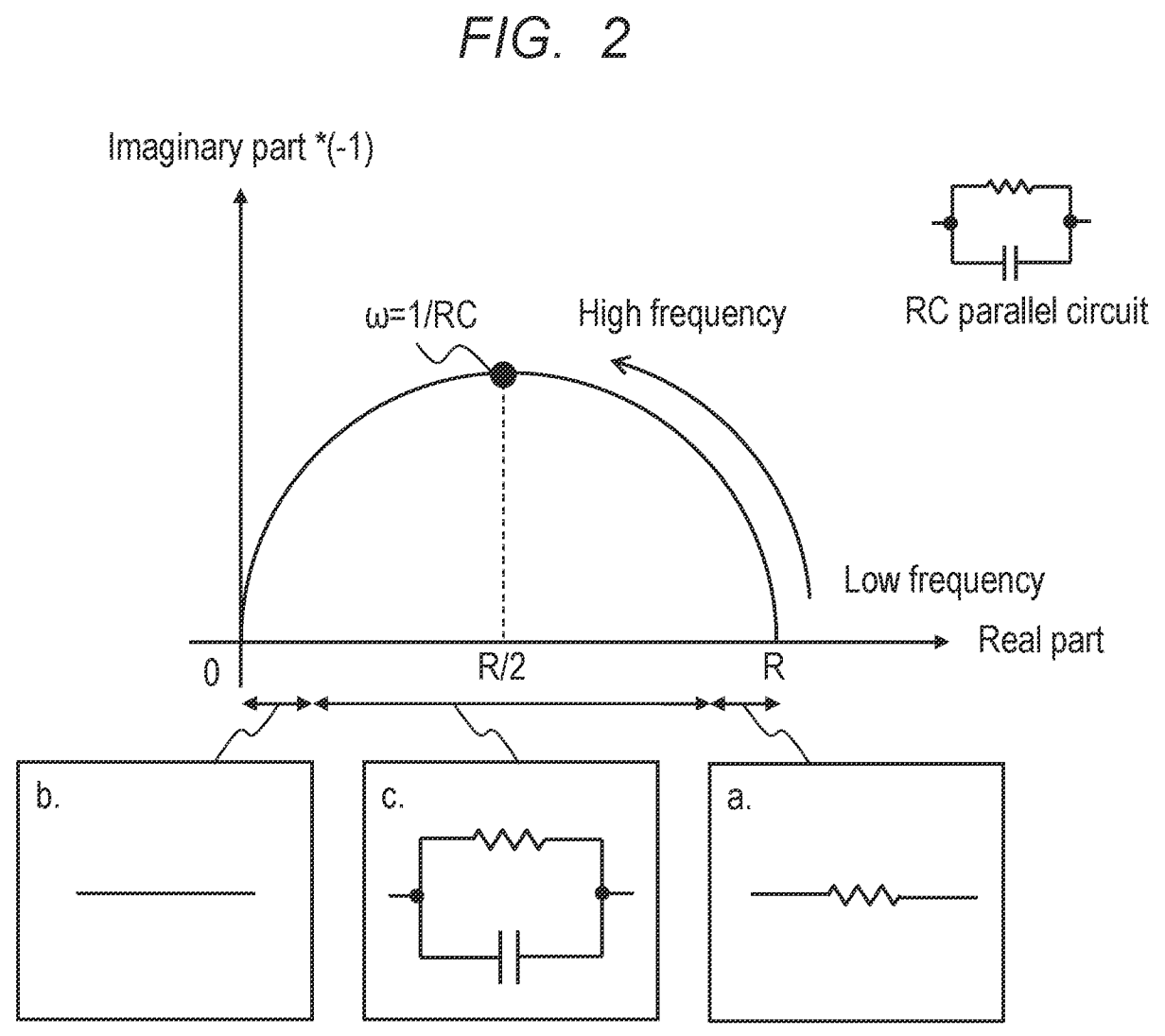
Figure 3:
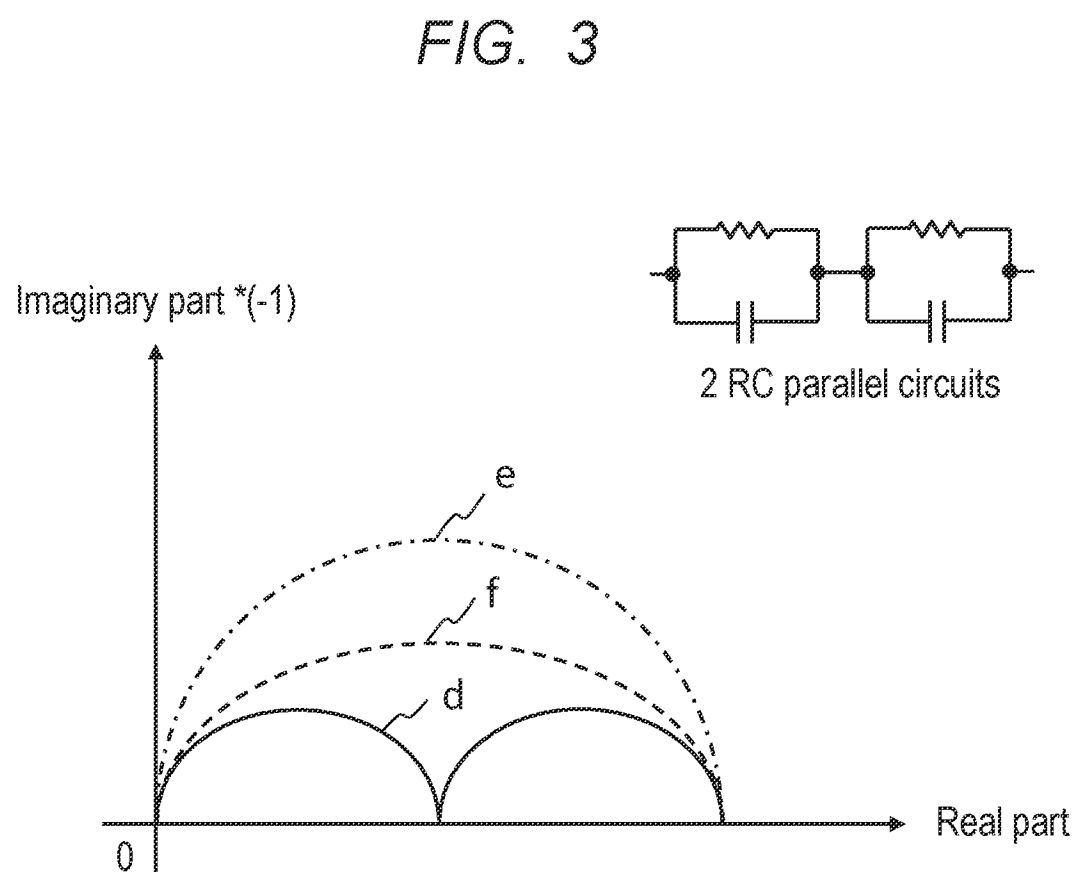

FIG. 2 shows a case where there is one RC parallel circuit, but when there are two RC parallel circuits, the combined impedance Z is shown in FIG. 3 and can be classified as follows. d. When the ratio of the values of 1/RC is large between two RC parallel circuits, for example, when the ratio is 100 times or more, the combined impedance Z is two semicircles. e. When the ratio of the values of 1/RC is small between two RC parallel circuits, for example, 1/100 or less, the combined impedance Z becomes one semicircle. f. When the ratio of the values of 1/RC between the two RC parallel circuits is between case d and case e, the combined impedance Z is not a semicircle.

In the battery simulator, the above-described frequency corresponds to the monitoring frequency of the battery monitoring sys tem (the battery simulator operates in synchronization with the monitoring frequency). Therefore, the RC parallel circuit optimization program 113 of the first embodiment optimizes the configuration of the battery equalization circuit program 114 in consideration of the characteristics of the combined impedance of the RC parallel circuit as described above.

FIG. 4 is an overall flowchart of the RC parallel circuit optimization program 113. When the RC parallel circuit optimization program 113 is executed by CPU 111, the battery monitoring frequency of the battery control system 130 is first acquired (step S400).

Next, the RC parallel circuit optimization program 113 compares the obtained monitoring frequency with 1/RC of the RC parallel circuit which is a battery equivalent circuit (step S401). The R and C of the RC parallel circuit are determined in advance according to the actual battery.

Next, the RC parallel circuit optimization program 113 optimizes (approximates) the RC parallel circuit based on the comparison-result, thereby generating the battery equalization circuit program 114 (step S402).

Figure 5:
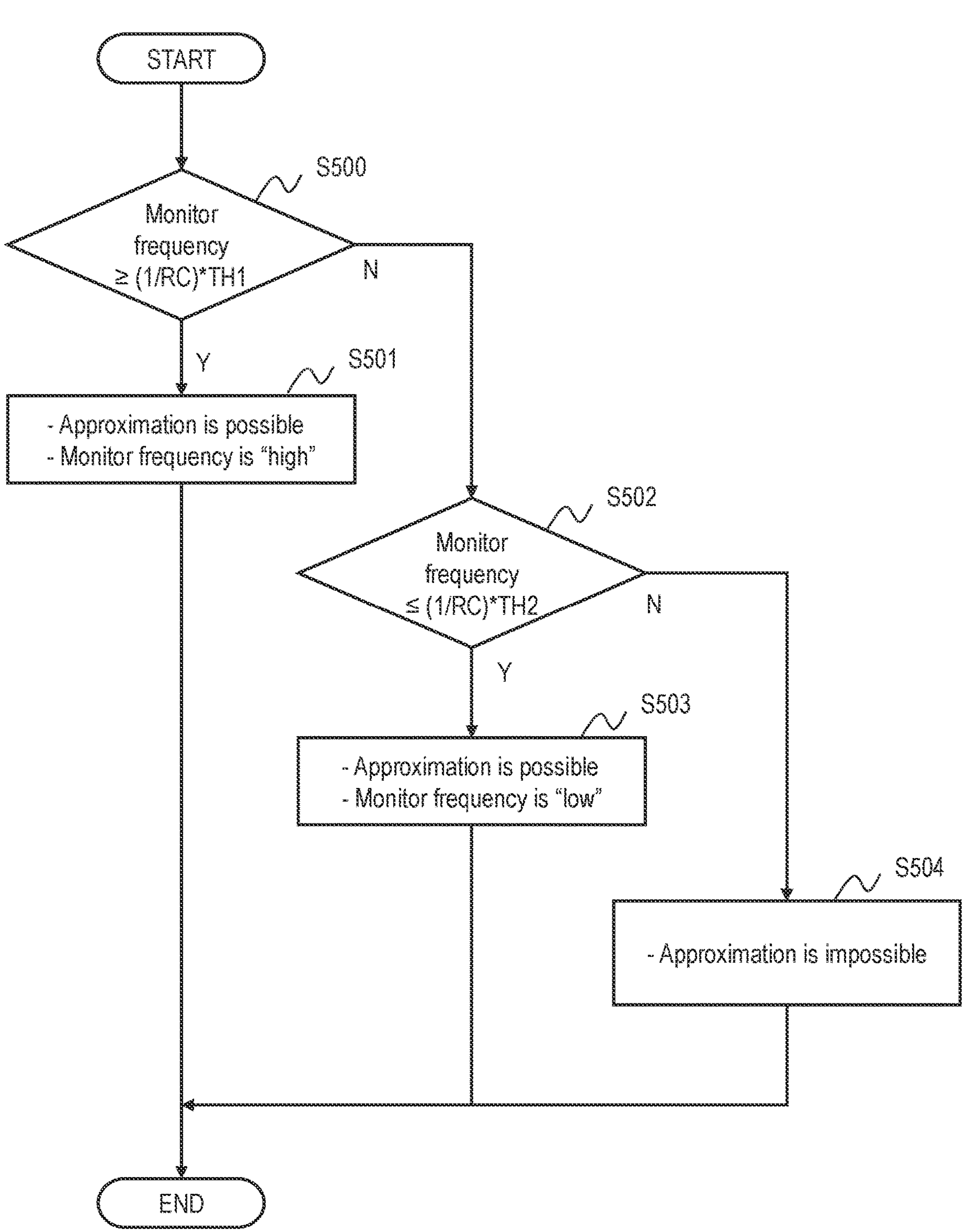
FIG. 5 is a flowchart for explaining the operation of the embodiment.

FIG. 5 is a detailed flow chart of step S401 of FIG. 4. First, the RC parallel circuit optimization program 113 compares the obtained monitoring frequency with a value obtained by multiplying the value of 1/RC by the threshold 1 (TH1) (step S500). Here, the TH1 is, for example, "100". If the monitored frequency is greater than the 1/RC multiplied by the threshold 1 (TH1) (S500 is YES), the RC parallel circuit optimization program 113 determines that the frequency is "approximatable, high frequency" (step S 501).

When the step S500 is NO, the RC parallel circuit optimization program 113 compares the obtained monitoring frequency with the value of 1/RC multiplied by the threshold 2 (TH2) (step S502). Here, the TH2 is, for example, "1/100". When the monitoring frequency is smaller than the value obtained by multiplying the value of 1/RC by the threshold 2 (TH2) (S502 is YES), the RC parallel circuit optimization program 113 determines that the frequency is "approximatable, low frequency" (step S503).

Figure 6:
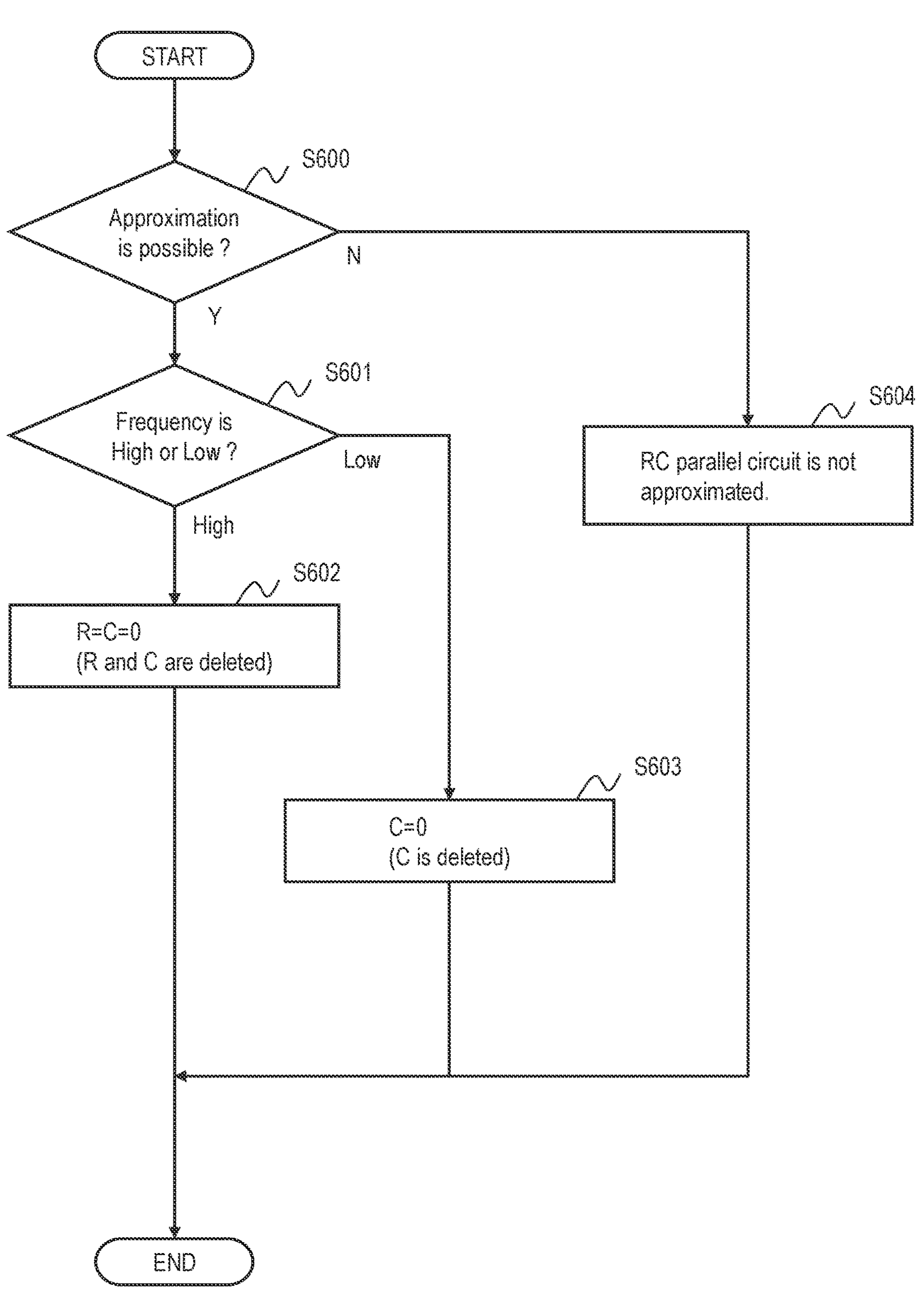
FIG. 6 is a flowchart for explaining the operation of the embodiment.

When step S502 is NO, the RC parallel circuit optimization program 113 determines that "cannot be approximated" (step S504). FIG. 6 is a detailed flow chart of step S402 of FIG. 4. First, based on the determination of the step S401, the RC parallel circuit optimization program 113 determines whether or not the RC parallel circuit can be approximated (step S600). If it is determined that approximation is not possible (S600 is NO), the RC-parallel circuit is not approximated (not changed) (step S604). If it is determined that the frequency is approximatable (S600 is YES), it is determined whether the frequency is high or low (step S602). When it is determined that the frequency is high (High in S601), R and C of the RC parallel circuit become "0" (R and C are deleted). When it is determined that the frequency is low (low at S601), C of the RC-parallel circuit becomes "0" (C is deleted).

By the operation of the RC parallel circuit optimization program 113 as described above, the configuration of the RC parallel circuit incorporated in the battery equalization circuit program 114 is optimized. The battery simulator 120 simulates the operation of the actual battery by executing the battery equalization circuit program 114. Since the R and/or C of the RC parallel circuit incorporated in the battery equalization circuit program 114 is eliminated by optimization, the CPU load and the amount of used memory can be reduced as compared with the conventional one.

Figure 7:
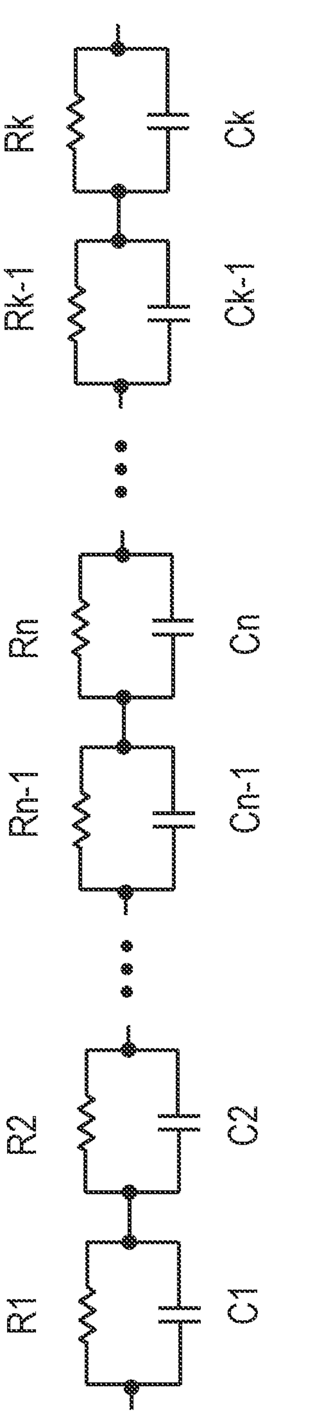
FIG. 7 is a diagram for explaining two or more RC parallel circuits according to the embodiment.

Although the above has been described in a case where the battery equivalent circuit can be represented by one RC parallel circuit, the present embodiment is also applicable to the case of two or more RC parallel circuits. FIG. 7 is a battery equalization circuit composed of k (k is an integer of 2 or more) RC parallel circuits. Each of the k RC parallel circuits is a parallel circuit of a resistor Rn and a capacitor Cn (2≤n≤k). For convenience of explanation, it is assumed that 1/(R1*C1)>1/(R2*C2)>. >1/(Rn−1*Cn−1)>1/(Rn*Cn) >. >1(Rk*Ck).

Figure 8:
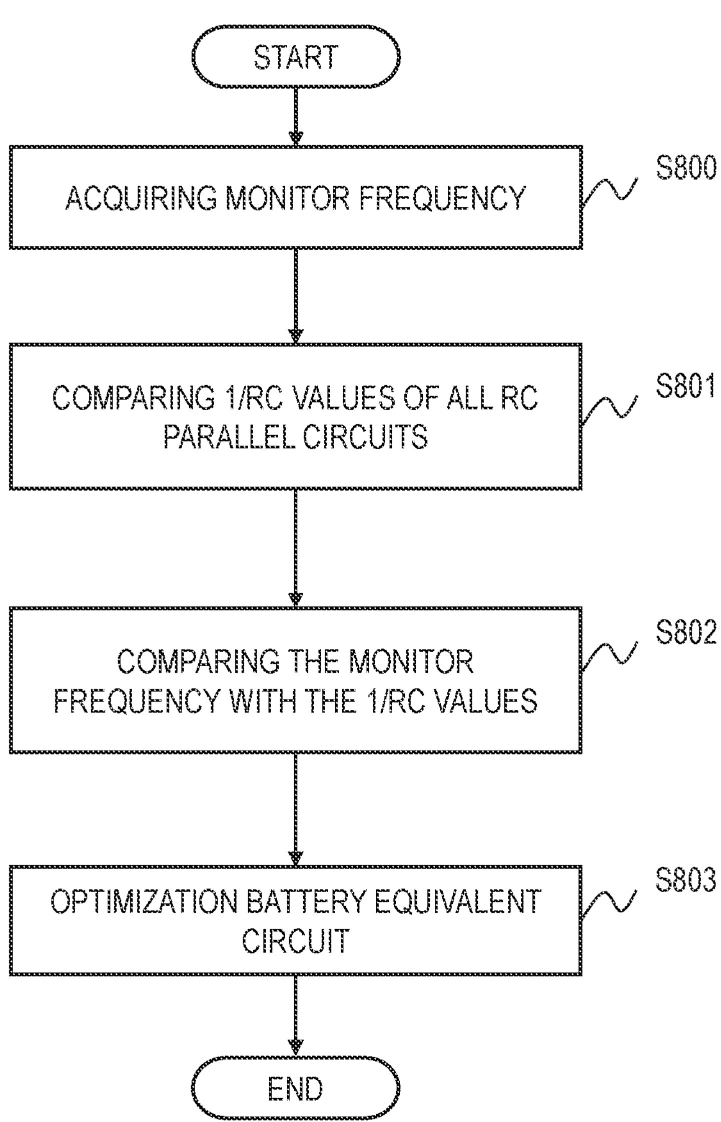
FIG. 8 is a flowchart for explaining the operation of the embodiment.

FIG. 8 is an overall flowchart of the RC parallel circuit optimization program 113 when there are two or more RC parallel circuits. When the RC parallel circuit optimization program 113 is executed by CPU 111, the battery monitoring frequency of the battery control system 130 is first acquired (step S800).

Next, 1/RC of all RC parallel circuits is compared (step S801). That is, k pieces of 1/(Rn*Cn) in FIG. 7 are compared.

Next, the obtained monitoring frequency is compared with k 1/(Rn*Cn) (step S802). Finally, based on the outcome of the step S 802, the k RC-parallel circuits are optimized (approximated) to generate the battery equalization circuit program 114 (step S803).

Figure 9:
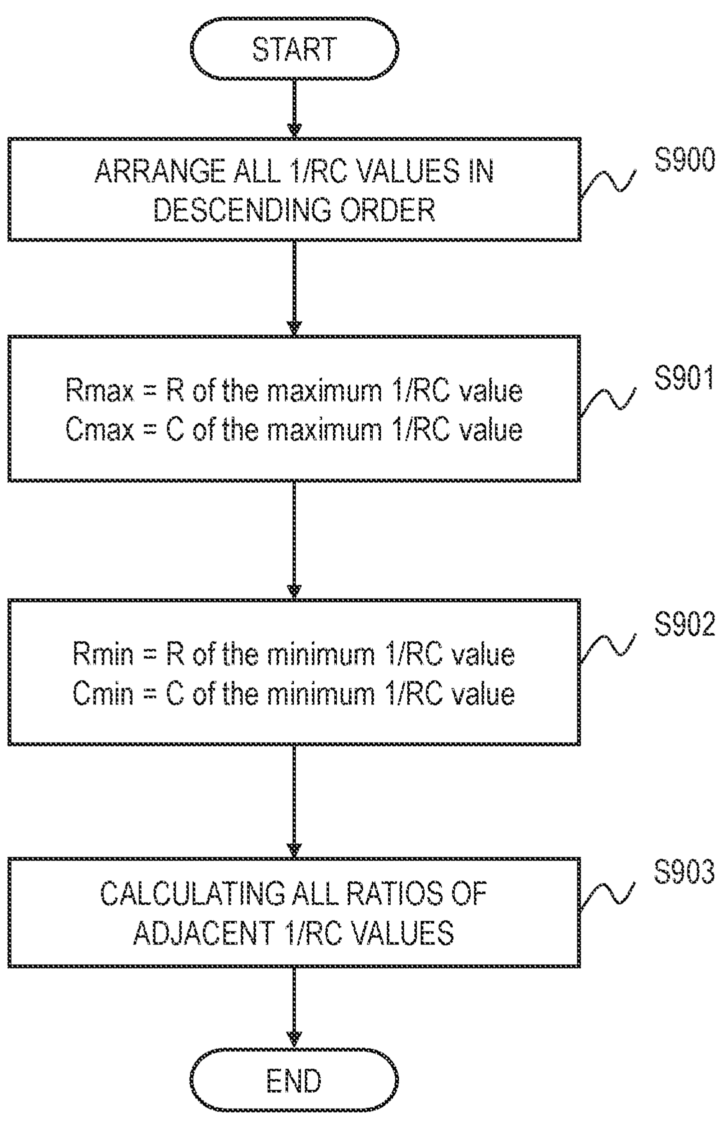
FIG. 9 is a flowchart for explaining the operation of the embodiment.

FIG. 9 is a detailed flow chart of S801 steps of FIG. 8. The RC parallel circuit optimization program 113 arranges 1/RC of all RC parallel circuits in descending order (step S900). In the case of FIG. 7, k 1/(Rn*Cn) are arranged in order from n=1 to n=k.

Next, R of the largest 1/RC is set to Rmax, and C is set to Cmax (step S901). In FIG. 7, Rmax is equal to R1 and Cmax is equal to C1.

Next, let R of the smallest 1/RC be Rmin, and let C be Cmin (step S902). In FIG. 7, Rmin is equal to Rk and Cmin is equal to Ck.

Next, the ratio of adjacent 1/RC, i.e., the ratio of 1/(Rn−1*Cn−1) and 1/(Rn*Cn) is calculated (step S903).

FIG. 10 is a detailed flow chart of S802 steps of FIG. 8. When all the ratios are equal to or greater than the threshold 3 (TH3; e.g., TH3=100) and the monitoring frequency is equal to or gr eater than the {1/(Rmax*Cmax)}*threshold 1 (TH1; e.g., TH1=10) (step S1000 is YES), the RC parallel circuit optimization program 113 determines that the ratio is "approximatable, a plurality of semicircles, and a high frequency" (step S1001).

When all the ratios are equal to or greater than the threshold value 3 and the monitoring frequency is equal to or less than {1/(Rmin*Cmin)}*threshold value 2 (TH2; e.g., TH2=10) (step S1002 is YES), the RC-parallel-circuit optimization program 113 determines that the ratio is "approximatable, a plurality of semicircles, and a low frequency" (step S1003).

When all of the ratios are equal to or greater than the thresh olds 3 and the monitoring frequency is equal to or less than 1/(Rn−1*Cn−1) and equal to or greater than 1/(Rn*Cn) (step S1004 is YES), the RC parallel circuit optimization program 113 determines that the ratio is "approximatable, a plurality of semicircles, and the normal frequency" (step S1005).

If all ratios are equal to or greater than the threshold 4 (TH 4; e.g., TH4=0.9) and equal to or less than the threshold 5 (TH 5; e.g., TH5=1.1), that is, if all ratios can be approximated to 1 (step S1006 is YES), the RC parallel circuit optimization program 113 determines that the ratio is "approximatable, one semi circle, unavailable frequency" (step S1007).

If NO in the step S1006, the RC parallel circuit optimization program 113 determines that "cannot be approximated" (step SS1008).

FIG. 11 is a detailed flow chart of step S803 of FIG. 8. First, based on the determination of the step S802, the RC parallel circuit optimization program 113 determines whether or not the RC parallel circuit can be approximated (step S1100). If it is determined that it cannot be approximated (S1100 is NO), all RC-parallel circuits are not approximated (not changed) (S1109 of step s). If it is determined that approximation is possible (S1100 is YES), the approximation is performed based on the number of semicircles and the frequency.

When a plurality of semicircles and high frequencies are determined (S1101 is YES), Rn and Cn of all RC parallel circuits become "0" (Rn and Cn are deleted) (step S1102).

When a plurality of semicircles and low frequencies are deter mined (S1103 is YES), Cn of all RC parallel circuits becomes "0" (Cn is deleted) (step S1104).

When a plurality of semicircles are determined to be normal frequencies (S1105 is YES), C1 to Cn−2 are "0", Cn+1 to Ck are "0", and Rn+1 to Rk are "0". That is, all RC-parallel circuits are optimized for circuits composed of R1 to Rn−2, Rn−1Cn1−1, RnCn (step S1106).

If one semicircle is determined (S1107 is YES), all RC parallel circuits are optimized in one RC parallel circuit. At this time, R of one RC parallel circuit is the sum value of all Rk, and C is the total value of all Ck.

As described above, the present embodiment is also applicable to a case where two or more RC parallel circuits are used as the battery equalization circuit.

As described above, the battery simulator according to the present embodiment can reduce the CPU load and the amount of used memory by optimizing the RC parallel circuit which is the battery equalization circuit.

It should be noted that the present invention is not limited to the above-mentioned embodiments, and various modifications can be made without departing from the gist thereof.

What is claimed is:

1. A battery simulator comprising:

a circuit simulator that simulates an operation of an RC parallel circuit which is an equivalent circuit of a battery to be monitored; and an RC parallel circuit optimization device that optimizes the RC parallel circuit based on a monitoring frequency of the battery, wherein the RC parallel circuit optimization device is configured to:

delete a capacitance value of the RC parallel circuit when the monitoring frequency is determined to be a low frequency, and delete resistance and capacitance values of the RC parallel circuit when the monitoring frequency is determined to be a high frequency, wherein the RC parallel circuit optimization device determines whether the monitoring frequency is a low frequency or a high frequency based on 1/RC, where R is a resistance value and C is a capacitance value of the RC parallel circuit, wherein the RC parallel circuit includes k (k is an integer of 2 or more) RC parallel circuits, and wherein the RC parallel circuit optimization device is configured to:

calculate 1/RC from each of k RC parallel circuits and a ratio of two 1/RC, and determine that the monitoring frequency is a low frequency or high frequency based on the calculated k 1/RC when the ratio of 1/RC is equal to or larger than a first threshold value.

2. The battery simulator according to claim 1, wherein when the monitoring frequency is larger than a value obtained by multiplying a maximum value of the calculated k 1/RC by a second threshold value, the RC parallel circuit optimization device determines the monitoring frequency as a high frequency, and deletes the resistance and capacitance values of the k RC parallel circuits.

3. The battery simulator according to claim 1, wherein when the monitoring frequency is smaller than a value obtained by multiplying a minimum value of the calculated k 1/RC by a third threshold value, the RC parallel circuit optimization device determines the monitoring frequency as a low frequency, and deletes the capacitance value of the k RC parallel circuits.

4. The battery simulator according to claim 1, wherein when the calculated k 1/RC are arranged in a descending order of values, and the monitoring frequency is between $1/(R_{n-1}*C_{n-1})$ and $1/(R_n*C_n)$ ($2 \le n \le k$), the RC parallel circuit optimization device deletes $C_1$ to $C_{n-2}$, $C_{n+1}$ to $C_k$ and $R_{n+1}$ to $R_k$.

5. The battery simulator according to claim 1, wherein when the ratio of 1/RC can be approximated to 1, the RC parallel circuit optimization device sets the k RC parallel circuits as one RC parallel circuit, and wherein the one RC parallel circuit includes a resistor having a sum value of the resistance values of the k RC circuits and a capacitance having a sum value of the capacitance values of the k RC circuits.

* * * * *